(12) United States Patent
Ruck et al.

(10) Patent No.: US 11,009,563 B2
(45) Date of Patent: May 18, 2021

(54) SIGNAL PROCESSING ARRANGEMENT FOR A HALL SENSOR AND SIGNAL PROCESSING METHOD FOR A HALL SENSOR

(71) Applicant: ams AG, Premstaetten (AT)

(72) Inventors: Dominik Ruck, Premstaetten (AT); Gerhard Oberhoffner, Premstaetten (AT)

(73) Assignee: AMS AG, Premstaetten (AT)

( * ) Notice: Subject to any disclaimer, the term of this patent is extended or adjusted under 35 U.S.C. 154(b) by 83 days.

(21) Appl. No.: 16/481,769

(22) PCT Filed: Jan. 31, 2018

(86) PCT No.: PCT/EP2018/052428
§ 371 (c)(1),
(2) Date: Jul. 29, 2019

(87) PCT Pub. No.: WO2018/141806
PCT Pub. Date: Aug. 9, 2018

(65) Prior Publication Data
US 2019/0369168 A1  Dec. 5, 2019

(30) Foreign Application Priority Data
Jan. 31, 2017  (EP) .................................... 17153931

(51) Int. Cl.
*G01R 33/00* (2006.01)
*G01R 33/07* (2006.01)
*H03M 1/12* (2006.01)

(52) U.S. Cl.
CPC ....... *G01R 33/0029* (2013.01); *G01R 33/075* (2013.01); *H03M 1/12* (2013.01)

(58) Field of Classification Search
CPC ......................... G01R 33/0029; G01R 33/075; G01R 15/202; H03M 1/12; H03M 1/1023
(Continued)

(56) References Cited

U.S. PATENT DOCUMENTS 9,448,288 B2 * 9/2016 Diaconu .............. G01R 33/075
2009/0212765 A1  8/2009 Doogue et al.
(Continued)

FOREIGN PATENT DOCUMENTS

EP  1498697  1/2005

OTHER PUBLICATIONS

International Search Report and Written Opinion in International Application No. PCT/EP2018/052428, dated May 14, 2018, 13 pages.
(Continued)

*Primary Examiner* — Christopher P McAndrew
(74) *Attorney, Agent, or Firm* — MH2 Technology Law Group LLP

(57) ABSTRACT

A signal processing arrangement for a Hall sensor comprises a signal path, a feedback path and a converter path. The signal path comprises a Hall element and a front-end amplifier which are connected in series and arranged to generate an output signal depending on a magnetic field. The feedback path comprises a compensation circuit and is coupled to the signal path. The converter path comprises an analog-to-digital converter and an offset compensation circuit and is coupled to the signal path. A switch network is coupled between the signal path, the feedback path and the converter path. In a compensation phase, the switch network electrically connects the feedback path to the signal path such that the compensation circuit generates a compensation signal which is coupled into the signal path. In a sampling phase, the switch network connects the signal path to the converter
(Continued)

path such that the output signal is reduced by the compensation signal is provided at the converter path.

17 Claims, 7 Drawing Sheets

(58) Field of Classification Search
USPC .......................................................... 324/251
See application file for complete search history.

(56) References Cited

U.S. PATENT DOCUMENTS

2009/0212865 A1* 8/2009 Mate .................... H03G 1/0035
330/258
2015/0338473 A1* 11/2015 Diaconu ................ G01D 5/145
324/251

OTHER PUBLICATIONS

Schell et al., "CMOS 3D Hall probe for magnetic field measurement in MRI scanner," New Circuits and systems conference (NEWCAS), IEEE 10th International, Jun. 17, 2012, pp. 517-520.
Draxelmayr et al., "A Chopped Hall Sensor with Small Jitter and Programmable True Power-on Function," IEEE Journal of Solid-State Circuits, Jul. 1, 2005, 40(7):1533-1540.

* cited by examiner

SIGNAL PROCESSING ARRANGEMENT FOR A HALL SENSOR AND SIGNAL PROCESSING METHOD FOR A HALL SENSOR

CROSS-REFERENCE TO RELATED APPLICATIONS

The present application is the national stage entry of International Patent Application No. PCT/EP2018/052428, filed on Jan. 31, 2018, which claims the benefit of priority of European Patent Application No. 17153931.5, filed on Jan. 31, 2017, all of which are hereby incorporated by reference in their entirety for all purposes.

This invention relates to a signal processing arrangement for a Hall sensor and to a signal processing method for a Hall sensor.

BACKGROUND OF THE INVENTION

In Hall sensor applications an output signal is prone to offset of a Hall element which itself can be much larger than a desired signal the application is supposed to convert. Typically, a low noise amplifier, LNA, is also implemented and adds to the offset. Therefore the Hall sensor application usually employs offset compensation techniques to reduce this effect and make it possible to convert the output signal using an analog-to-digital converter, ADC. At the moment current spinning and chopping are routinely used to adaptively compensate for the input offset by dividing up the desired signal and the error in the frequency domain and feeding back the offset into the system. Current schemes use an auto zero approach to eliminate the offset or enlarge the ADC dynamic range to cope with both signal and offset thus increasing the quantization noise of the sensor interphase.

FIG. 7 shows a prior art offset compensation arrangement for a Hall sensor. The arrangement comprises a signal path, a converter path and a feedback path. The signal path includes a series connection of a Hall element and a low noise amplifier as front-end amplifier. The Hall element is connected to a chopping circuit. An output of the front-end amplifier is connected to a first circuit node. The converter path comprises a series connection of an analog-to-digital converter, a first de-chopping circuit and a digital signal processor having an output terminal. Typically, a low pass filter is connected between the first circuit node and the analog-to-digital converter. The analog-to-digital converter is connected to the first de-chopping circuit via a second circuit node. The feedback path comprises a series connection of a second de-chopping circuit and a feedback digital-to-analog converter which connects the first circuit node to the second circuit node.

During operation the chopping circuit receives a chopping signal fchop which implements a spinning current in the Hall element. As a consequence the Hall element outputs two output signals S1, S2 which are provided at inputs V+, V− of the front-end amplifier. The front-end amplifier amplifies these signals S1, S2 which are then filtered and provides as output signal of the signal path when input into the converter path. The analog-to-digital converter converts the output signal into digital values. The first de-chopping circuit determines a digital offset corrected output value, e.g. as the difference of the digital values. The digital offset corrected output value may then be further processed by the digital signal processor, e.g. a cordic, to determine linear or angular position information related to the Hall element. If implemented as a cordic, the digital signal processor is arranged to digitally process signals from two or more channels in order to determine position and/or angle information, for example.

Current spinning and chopping by the chopping circuit are used to adaptively compensate for the input offset. As a consequence the desired sensor signals and their error due to offset of the Hall element and the front-end amplifier are divided in the frequency domain. Furthermore, the offset is negatively fed back into the signal path by means of the feedback path. The second de-chopping circuit determines a digital feedback offset output value, e.g. as the sum of the digital values. The digital feedback offset output value is converted into an analog feedback signal by means of the feedback digital-to-analog converter. The analog feedback signal then is injected into the signal path via the first circuit node and thereby subtracted from the output signal.

FIG. 8 shows another prior art offset compensation arrangement for a Hall sensor. The arrangement is a further development of the arrangement of FIG. 7. The signal path comprises a series connection of hall element, represented by two consecutive amplifiers, a mixer followed by an adder, the front-end amplifier, another adder and a buffer. The converter path is represented by the analog-to-digital, a first filter, another mixer and a second filter. The feedback path comprises a third filter and the feedback digital-to-analog converter.

The implementations shown in FIGS. 7 and 8 have some disadvantages. The analog-to-digital converters, ADC, are designed to cope with a maximum input in order to allow for a small quantization step. But with the offset added to the signal the ADCs may saturate and the signal is masked. The loop implemented by the feedback paths starts to decrease the offset based on the sampling frequency of the system but has also to maintain a stable loop therefore the maximum step the loop can do each step is limited. Until the loop is settled the resulting signal value is not valid because the ADCs may or may not have clipped due to a too high offset value. This fact limits the start-up time in low power applications. In order to create one sample the device first has to go through the complete offset compensation phase before the desired sample can be generated.

SUMMARY OF THE INVENTION

It is to be understood that any feature described hereinafter in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the signal processing arrangement for a Hall sensor and the signal processing method for a Hall sensor as defined in the accompanying claims.

An improved concept discussed below is based on the idea to compensate an offset of a Hall element directly at the signal front-end, thus taking an analog-to-digital converter, ADC, out of the equation and thereby eliminating the required waiting time. An offset compensation phase can be much quicker and the arrangement can do a wakeup-compensate-measure-power down cycle using less energy than in other solutions decreasing the average power consumption. Since in the improved concept the offset is compensated after the first phase the required startup time is substantially reduced because the first sample already is offset-free. The improved concept can be realized in a much smaller area than the current solution because existing structures of already existing cells can be adapted to form the functionality.

Part of the improved concept suggests that the offset loop is wrapped around the hall element and/or a front-end amplifier instead of involving the whole signal chain. Since the ADC offset can be compensated using the chopping and current spinning approaches the remaining target of the improved concept is to reduce the offset to an amount where it fits in the ADC dynamic range already at the first sampling phase.

In at least one embodiment a signal processing arrangement for a whole sensor comprises a signal path, a feedback path and a converter path. The signal path comprises a Hall element and a front-end amplifier connected in series. The signal path is arranged to generate an output signal depending on a magnetic field. The feedback path comprises a compensation circuit and is coupled to the signal path. The converter path comprises an analog-to-digital converter and an offset compensation circuit, and is coupled to the signal path. The switch network is coupled between the signal path, the feedback path and the converter path.

In a compensation phase the switch network electrically connects the feedback path to the signal path. By way of the electrical connection the compensation circuit generates a compensation signal which is coupled into the signal path. In a sampling phase the switch network electrically connects the signal path to the converter path. By way of the electrical connection the output signal is reduced by the compensation signal and is provided at the converter path.

In at least one embodiment in the compensation phase, the switch network electrically connects the feedback path to the signal path while the converter path is electrically disconnected from the signal path.

In at least one embodiment the compensation circuit comprises a feedback analog-to-digital converter connected to the switch network. Furthermore, the feedback digital-to-analog converter is coupled to the feedback analog-to-digital converter by means of a feedback adder.

In at least one embodiment the feedback path comprises a negative feedback loop.

In at least one embodiment in the compensation phase the feedback path is arranged to adjust the compensation signal such that the output signal reaches a zero signal and/or a predetermined target signal.

In at least one embodiment the feedback path comprises a register to save a digital value indicative of the compensation signal in the compensation phase. Furthermore, the feedback path comprises an auxiliary amplifier which is connected to the signal path by on the switch network. The auxiliary amplifier is arranged to provide the compensation signal to the signal path.

In at least one embodiment the front-end amplifier comprises an adjustable compensation source. The compensation source is arranged to receive the compensation signal and reduce the output signal by the compensation signal.

In at least one embodiment the front-end amplifier comprises a current mirror having a first and a second transistor branch. The adjustable compensation source comprises an adjustable bias current source and a compensation resistor which are arranged in a connecting branch of the current mirror between the first and the second transistor branches.

In at least one embodiment the offset compensation circuit comprises a dechopping circuit operating on a chopping clock signal. The compensation phase and the sampling phase comprise at least two compensation sub-phases and two sampling sub-phases which are synchronized to the clock signal. The feedback path is arranged to combine respective compensation signals from the compensation sub-phases into the compensation signal.

In at least one embodiment the control unit is arranged to operate the switching network according to the compensation phase and the sampling phase.

In at least one embodiment signal processing method for a Hall sensor comprises the following steps. A signal processing arrangement comprises a signal path comprising a Hall element and a front-end amplifier connected in series, a feedback path comprising a compensation circuit and a converter path comprising an analog-to-digital converter and an offset compensation circuit.

By means of the signal path an output signal is generated. In a compensation phase the signal path is electrically connected to the feedback path. The compensation signal is generated by means of the compensation circuit. The compensation signal is coupled into the signal path. During sampling phase the signal path is electrically connected to the converter path. The output signal is reduced by the compensation signal. Finally, the reduced output signal is provided at the converter path.

In at least one embodiment the compensation signal is saved in the compensation phase and applied to the output signal in the sampling phase.

In at least one embodiment the compensation signal is adjusted such that the output signal reaches his zero signal and/or a predetermined target signal during the compensation phase.

In at least one embodiment the compensation signal is generated by means of a negative feedback of the feedback path. Generating the compensation signal involves an analog-to-digital conversion of the output signal followed by a digital-to-analog conversion. For example, the compensation signal is established in an ADC slope process comparable to a successive approximation concept.

In at least one embodiment the output signal, in the compensation phase, is the chopped and offset compensated downstream and analog-to-digital conversion by means of the analog-to-digital converter.

In the following, the concept presented above is described in further detail with respect to drawings, in which exemplary embodiments are presented.

In the exemplary embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

DETAILED DESCRIPTION

Figure 1:
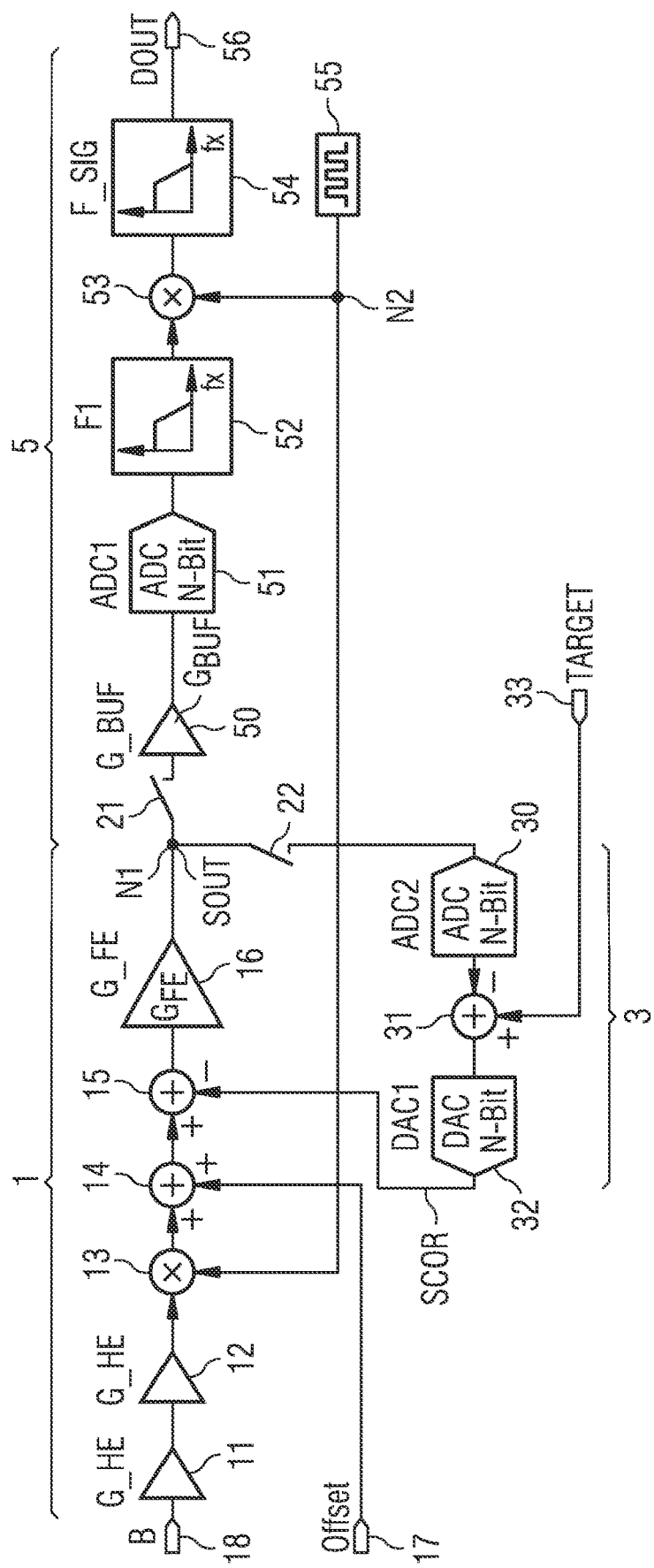
FIG. 1 shows an exemplary embodiment of a signal processing arrangement for a Hall sensor.

FIG. 1 shows an exemplary embodiment of a signal processing arrangement for a Hall sensor. The signal processing arrangement comprises a signal path 1, a feedback path 3 and a converter path 5.

The signal path 1 comprises a series connection with a Hall element 11, 12, a first multiplier 13, a first adder 14, a second adder 15 and a front-end amplifier 16. In the drawing the Hall element 11, 12 is represented by two consecutive amplifiers 11 and 12. The front-end amplifier 16 is coupled to the feedback path 3 and to the converter path 5 by means of a switching network. The switching network comprises a first switch 21 and a second switch 22 and are connected to a first circuit node N1. An offset terminal 17 is connected to a positive input of the first adder 14.

The feedback path 3 spans from the first circuit node N1 via the second switch 22 to the second adder 15. The second switch 22 is connected to a feedback analog-to-digital converter 30 which is connected in series to a third adder 31 and a feedback digital-to-analog converter 32. In this embodiment the feedback analog-to-digital converter 30 is connected to a negative input of the third adder 31. A positive input of the third adder 31 is connected to a target terminal 33. The feedback digital-to-analog converter 32 is connected to a negative input of the second adder 15.

The converter path 5 is connected to the first circuit node N1 and comprises a series connection of a buffer 50, an analog-to-digital converter 51, a first filter 52, a second multiplier 53 and a second filter 54. Furthermore, the converter path 5 comprises a de-chopping circuit 55 which is connected to the second multiplier 53 via a second circuit node N2. Additionally, the second circuit node N2 is connected to the first multiplier 13.

During operation the Hall element 11, 12 detects a magnetic field B applied at a field input 18. Typically, the Hall element 11, 12 is operated in a spinning current configuration and generates corresponding magnetic field signals S1, S2 depending on the flow of current in the Hall element. These signals are amplified by means of the front-end amplifier 16. Furthermore, an offset can be added via the offset terminal 17, e.g. to modulate an offset from the Hall element 11, 12 and the front-end amplifier 16 which typically have the same phase. Both the Hall element 11, 12 and the front-end amplifier 16 are subject to offsets which is added as an additional signal component to an output signal SOUT of the signal path 1. In other words the offset of both Hall elements 11, 12 and front-end amplifier 16 are superimposed on the magnetic field signal.

The converter path 5 is arranged to convert the analog output signal SOUT of the signal path 1 into a digital output value DOUT. Basically, the conversion is performed by means of the analog-to-digital converter 51 but is complemented by filtering, e.g. low pass filtering, by means of the first filter 52. The resulting digital value is dechopped using the de-chopping circuit 55 and the second multiplier 53. The de-chopped digital value is filtered, e.g. low pass filtered, by means of the second filter 52 and provided as the digital output value DOUT at an output terminal 56. Thus, the converter path 5 performs offset correction using chopping and current spinning.

However, offset correction by chopping and current spinning occurs after analog-to-digital conversion and may, thus, be limited by the bandwidth of the analog-to-digital converter 51. In order to reduce this limitation, the feedback path 3 is designed to generate a compensation signal TARGET which is coupled or fed back into the signal path 1. Basically, the feedback path 3 is constructed as a negative feedback loop so the compensation signal SCOR is subtracted from the output signal SOUT. The compensation signal SCOR can be influenced via the target terminal 33, e.g. by applying a target signal TARGET at the target terminal 33. However, the compensation signal TARGET is largely determined by the implementation of the feedback analog-to-digital converter 30 and the feedback digital-to-analog converter 32 which, considered together, constitute a compensation circuit. Further details will be discussed in FIG. 2.

For example, the signal processing arrangement is operated in consecutive phases including a compensation phase ΦCOMP and a sampling phase ΦSAMP. The phases are largely determined by switching states of the first and the second switch 21, 22. During the compensation phase ΦCOMP, the first and second switch electrically connect the feedback path 3 to the signal path 1. The output signal SOUT from the front-end amplifier 16 is fed into the feedback path 3 which generates the compensation signal SCOR. The compensation signal SCOR can be fed into the signal path 1 right away or be saved in a register (see FIG. 5) and only applied during the sampling phase ΦSAMP. During the sampling phase ΦSAMP is the first and the second switch 21, 22 connect the signal path 1 to the converter path 5 and the output signal SOUT, reduced by the compensation voltage SCOR, is provided at the analog-to-digital converter 51.

Due to the compensation signal SCOR established in the compensation phase ΦCOMP the output signal SOUT can be reduced to an amount where it better fits to the dynamic range of the analog-to-digital converter 51 during the sampling phase ΦSAMP. The compensation signal SCOR can be superimposed with the compensation phase ΦCOMP and sampling phase ΦSAMP running in parallel or the compensation signal SCOR is saved and only presented to the signal path 1 during the sampling phase ΦSAMP. In both cases, bandwidth requirements of the analog-to-digital converter 51 can be relaxed and, in turn, startup times can be reduced. This is largely due to the fact that the feedback path 3 is "wrapped" around the front-end amplifier 16 instead of being part of the converter path 5.

In another embodiment (not shown) the feedback path 3 is coupled back to the Hall element 11, 12 instead of the front-end amplifier 16. For example, the compensation signal SCOR can be injected directly into the Hall element 11, 12 which is then detuned by a value determined by the compensation signal SCOR. Alternatively, the compensation signal can be injected downstream the Hall element 11, 12 and before the front-end amplifier 16.

Figure 4:
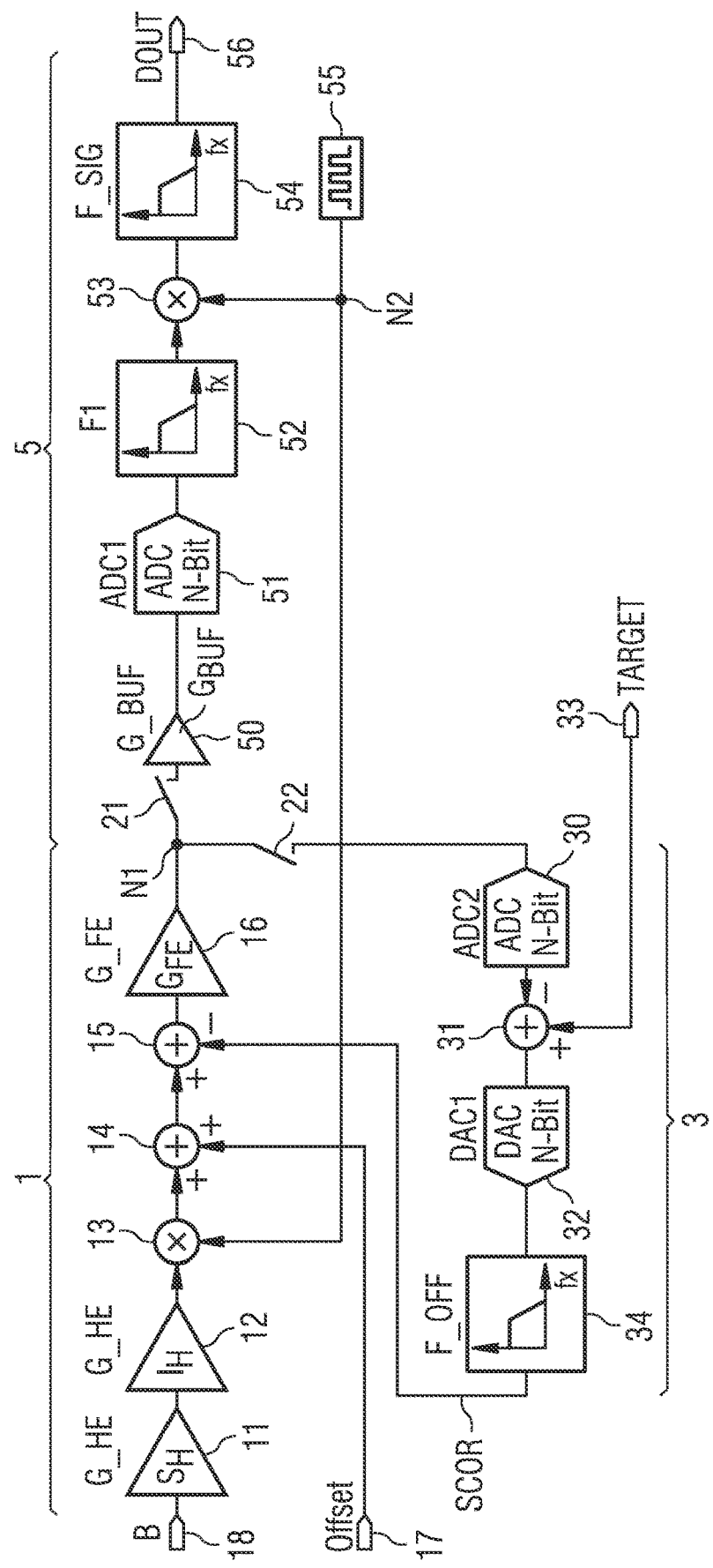
FIG. 4 shows another exemplary embodiment of a signal processing arrangement for a Hall sensor.

The first filter 52 in FIGS. 1 and 4 may alternatively be arranged in front of the analog-to-digital converter 51. This way the first filter may act as an antialiasing filter. Furthermore, two filters may also be implemented, one in front and one downstream the the analog-to-digital converter 51.

Figure 2:
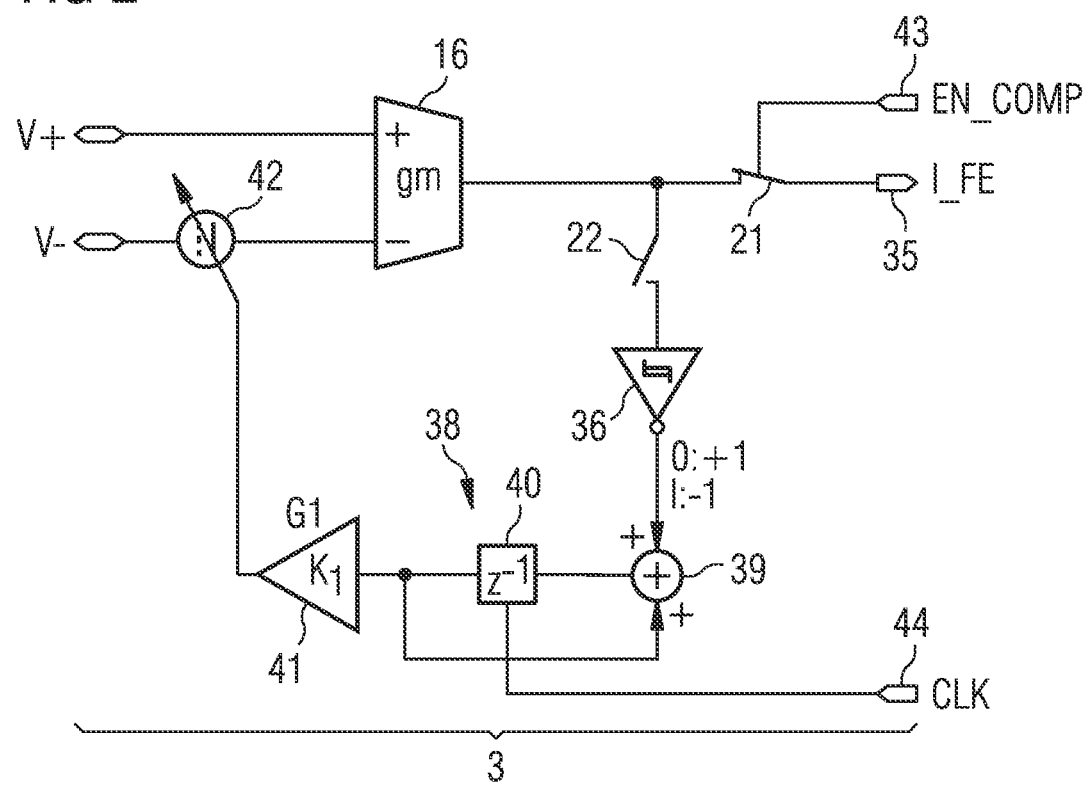
FIG. 2 shows an exemplary embodiment of a feedback path.

FIG. 2 shows an exemplary embodiment of a feedback path. The drawing represents a very basic representation of one possible compensation scheme to generate a compensation signal TARGET. The front-end amplifier 16 is represented as a low noise amplifier LNA. For example, the front-end amplifier 16 is realized as an operational transconductance amplifier, OTA, with a transconductance gm. The amplifier 16 has two input terminals V+, V− to receive a differential input voltage from the Hall element 11, 12. On its output side the front-end amplifier 16 is connected to a current output terminal 35 via the first switch 21 which can be operated by means of an enable terminal 43. Furthermore, the output side of the front-end amplifier 16 is connected to the input side of an inverting comparator, inverter 36, with hysteresis. The output side of the inverter 36 is connected to a low pass filter 38 comprising a fourth adder 39 and a delay element 40. The low-pass filter is connected to a clock terminal. An auxiliary amplifier 41 connects an output of the low-pass filter 38 to an adjustable compensation source 42 arranged at the negative input side of the front-end amplifier 16.

During the compensation phase ΦCOMP a nominal output signal SOUT is generated by the Hall element 11, 12 which is superimposed with an offset, denoted offset signal hereinafter (see FIG. 1 or 4). The feedback path 3 essentially is designed as a negative feedback loop so that the offset signal can be regulated by generating a zero signal as output of the front-end amplifier 16. Thus, the feedback path 3 essentially is designed to generate, during the compensation phase ΦCOMP, a zero signal as signal output of the signal path 1. A compensation voltage VCOR is used during the sampling phase ΦSAMP to generate an offset reduced output signal SOUT to be provided at the converter path 5 for analog-to-digital conversion and further signal processing.

The zero signal can be adjusted by means of a target signal TARGET applied to the target terminal 33 (not shown, see also FIG. 1). The target signal TARGET can be adjusted to different signal levels. A zero level corresponds to the zero signal mentioned above. However, any value in between is possible and only restricted by the specific needs of a given application.

During the compensation phase ΦCOMP the output of the front-end amplifier 16 is closed to the current output terminal 35. This is achieved by means of an enable signal EN_COMP applied the enable terminal forcing the first switch 21 to open and electrically disconnect the front-end amplifier 16 to the current output terminal 35. At the same time second switch 22 is closed. This essentially turns the current output of the front-end amplifier 16 into a comparator, i.e. a high ohmic current source. In fact, a gain of the front-end amplifier 16 is high as there is no further resistance on its output side. Depending on the value of the transconductance gm, the amplifier 16 generates an output current IFE. As a consequence the output of the front-end amplifier 16 (operated as comparator) is at a positive supply voltage VDD if the input offset signal is positive in value or at a negative supply voltage VSS if the offset signal is negative in value.

The output signal SOUT of the front-end amplifier 16, represented as output current IFE, is injected into the feedback path 3 via the second switch 22. Basically, the output signal SOUT is then corrected by the compensation signal SCOR in the digital domain and a corresponding compensation voltage VCOR is generated in the analog domain which is then fed back into the signal path 1. Thus, the feedback path 3 essentially constitutes a negative feedback loop which is repeatedly passed through until a stable output signal SOUT is established. The compensation signal SCOR is established in an ADC slope process comparable to a successive approximation concept.

For example, the feedback path 3 in this embodiment constitutes an integrating register which can be present during a reset to a mid-code (FSR/2). If the output signal SOUT of the front-end amplifier 16 is 0, i.e. indicating an offset smaller in value than 0, the feedback path 3 by means of the inverter 36 starts adding 1's to the compensation signal SCOR (digital), e.g. by increasing a compensation code at every clock edge of a clock signal CLK applied to the delay element 40 via a clock terminal 44. Basically, the low pass filter 38 constitutes a digital-to-analog converter depending on the clock signal CLK applied at the clock terminal 44. For example, the filter or ADC constitutes an up/down counter. The filter could settle within a settling time determined by the filter constant of the first filter 52. For example, using a 30 kHz filter and N=32 offset steps requires 16 pulses. A clock frequency fclk can be derived from Tclk<1/(2·π·fclk·N/2) which, given the values above, may result in 3 MHz. Thus, depending on the number of offset steps the clock could range from 2 to 10 MHz.

The auxiliary amplifier 41 amplifies the (analog) compensation signal SCOR. Depending on the compensation signal SCOR the adjustable compensation source 42 is adjusted such that the compensation voltage VCOR is injected in the negative input V− of the front-end amplifier 16. As soon as the offset voltage VOUT including the compensation voltage VCOR cross 0 V the output signal SOUT of the front-end amplifier 16 flips to 1 and the integrator decreases its code again in the following clock edge of the clock signal CLK. After several loops the feedback path 3 toggles with ±1 LSB, least significant bits, around 0 V.

Figure 3:
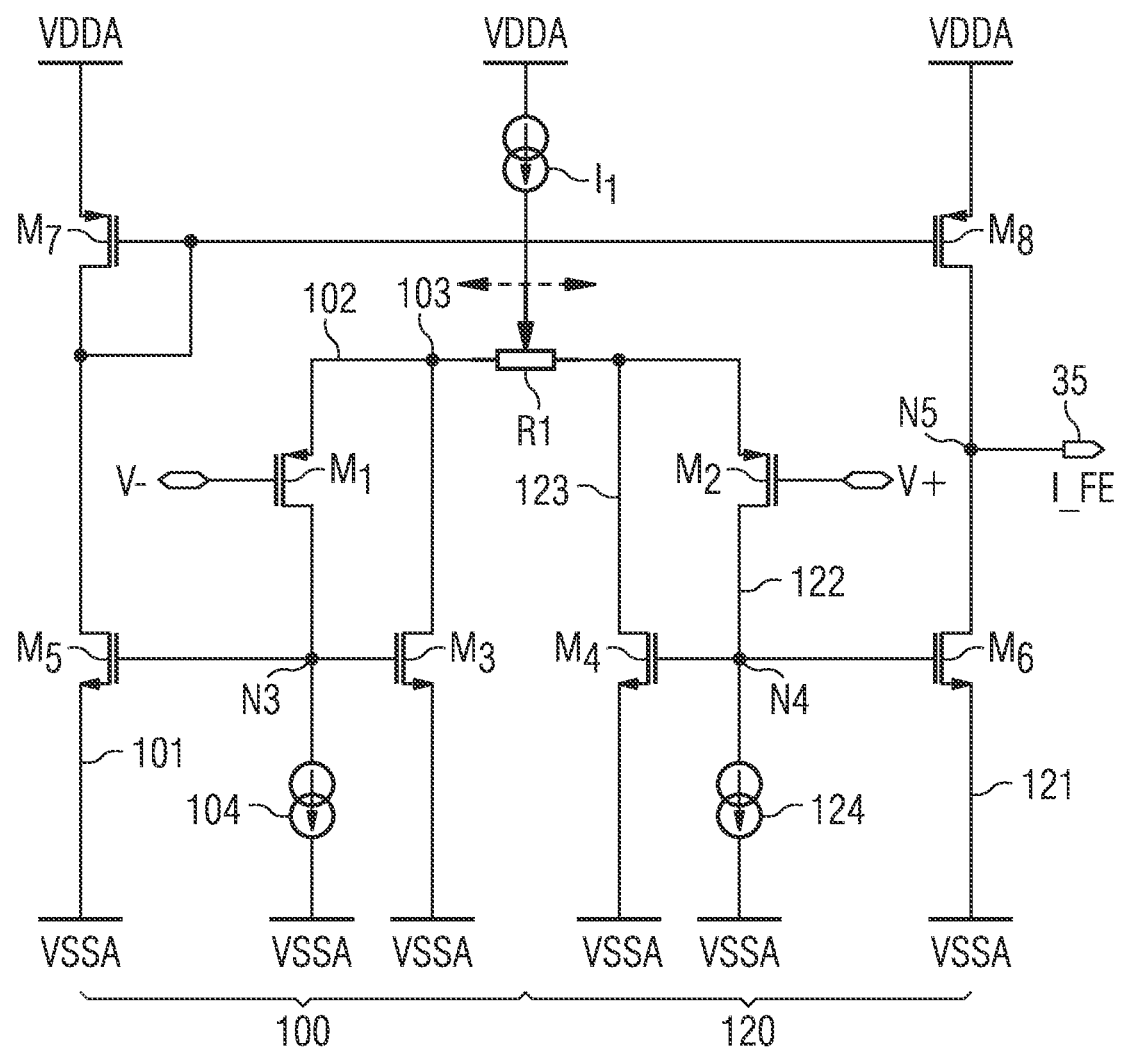
FIG. 3 shows an exemplary embodiment of a front-end amplifier.

FIG. 3 shows an exemplary embodiment of a front-end amplifier. The front-end amplifier 16 is divided into two transistor branches 100, 120 which are connected as a current mirror. Furthermore, the two transistor branches 100, 120 are connected via a compensation resistor R1 which is connected to VDDA (positive supply voltage VDD analog) via an adjustable bias current source I1.

The first transistor branch 100 comprises first current path 101 comprising transistors M5 and M7 connected between VDDA and VSSA (negative supply voltage VSS analog). A second current path 102 comprises transistor M1 which is connected between the compensation resistor R1 and VSSA via a first current source 104. A control side of transistor M1 is connected to the negative input terminal V−. A third current path 103 is connected between both the compensation resistor R1 and the second current path 102 and VSSA. Finally, the three current paths 101, 102, 103 are interconnected via respective control sides of transistors M5 and M3 and circuit node N3.

The second transistor branch 120 comprises first current path 121 comprising transistors M6 and M8 connected between VDDA and VSSA (negative supply voltage VSS analog). A second current path 122 comprises transistor M2 which is connected between the compensation resistor R1 and VSSA via a first current source 124. A control side of transistor M2 is connected to the positive input terminal V+. A third current path 123 is connected between both the compensation resistor R1 and the second current path 122 and VSSA. The three current paths 121, 122, 123 are interconnected via respective control sides of transistors M4 and M6 and circuit node N4. Circuit node N5 located between the transistors M6 and M8 is connected to the current output terminal 35.

In principle the two transistors M1 and M2 copy the input voltage, i.e. the output signal of the Hall element 11, 12, onto the compensation resistor R1. The resulting current flow through R1 is modulating a current through transistors M3 and M4 and the difference in current is copied to the current output terminal 35 using transistors M5, M6 and M7, M8 respectively. The compensation source is implemented by moving the injection point of the current source I1 within the compensation resistor R1, e.g. the more left or right the injection point moves the more differential voltage is generated artificially on R1 thus changing the current in M3 and M4 and therefore the output. This asymmetry on the compensation resistor R1 is a measure of the offset contribution in the output signal of the signal path 1.

In a certain sense the front-end amplifier 16 is used as a comparator and the feedback path 3 is used to adjust a zero signal as the output of the front-end amplifier during compensation phase ΦCOMP. Using the clock signal CLK with high frequencies a high number of taps is possible. The front-end amplifier can be used with a higher bandwidth which is one reason why the start-up time of the proposed signal processing arrangement can be improved. Furthermore, since a current source is typically needed regardless whether the offset compensation is built in or not the feedback path may reuse a structure already in place in the front-end. The switches may be added in addition to the existing structure.

When it comes to speed considerations the front-end amplifier 16 essentially is an OTA with a transconductance of gm=2/R1. The bandwidth can be seen as a combination of the transconductance gm of the OTA and a capacitive loading of the output giving a bandwidth of BW=gm·(2·π·C)$^{-1}$. Assuming a loading capacitance of 0.5 pF and a resistance R in the range of 1 kΩ) the bandwidth BW of the system is in the range of 600 MHz. This will limit the bandwidth way before this point (around 10 MHz). For a settling to 90% 3τ can be considered setting the conversion time needed for one step to around 5 ns. A 128 steps DAC can be evaluated in less than 20 μs compared to 3 conversions at 20 kHz sampling rate (150 μs) using a conventional approach.

One limiting factor for the proposed concept is the noise generated within such a high bandwidth, e.g. by means of the adjustable current source, but this only limits the resolution of the offset DAC which typically is not a critical parameter for the system. For a ±5 mV input related offset an 8 bit DAC would give a LSB size of 39 μV. At 10 MHz the estimated input related RMS noise would be around 34 μVRMS yielding a maximum error of around 100 μV after the compensation is done.

FIG. 4 shows another exemplary embodiment of a signal processing arrangement for a Hall sensor. This embodiment is a further development of the one depicted in FIG. 1. In addition, the feedback path 3 comprises a low-pass filter after the feedback digital-to-analog converter. This filter may be implemented around the concept discussed in FIG. 2.

The basic approach discussed so far employs an auto zero concept of the front-end amplifier during compensation phase ΦCOMP. However, in some embodiments during in this phase not only the offset of the Hall element and the compensation phase ΦCOMP also the desired signal indicating an applied magnetic field B can be contributing to the signal output SOUT of the signal path 1. Thus, the proposed concept would compensate for both desired signal and offset. Since the output signal S1, S2 of the Hall element is chopped it would change its sign in the following sampling phase ΦSAMP requiring the ADC dynamic range to cope with the twice the signal amplitude. An improved approach is to run two compensation phases ΦCOMP1, ΦCOMP2 with the signal changing its sign and use the resulting compensation values to calculate the offset without contribution from the desired signal.

Figure 5:
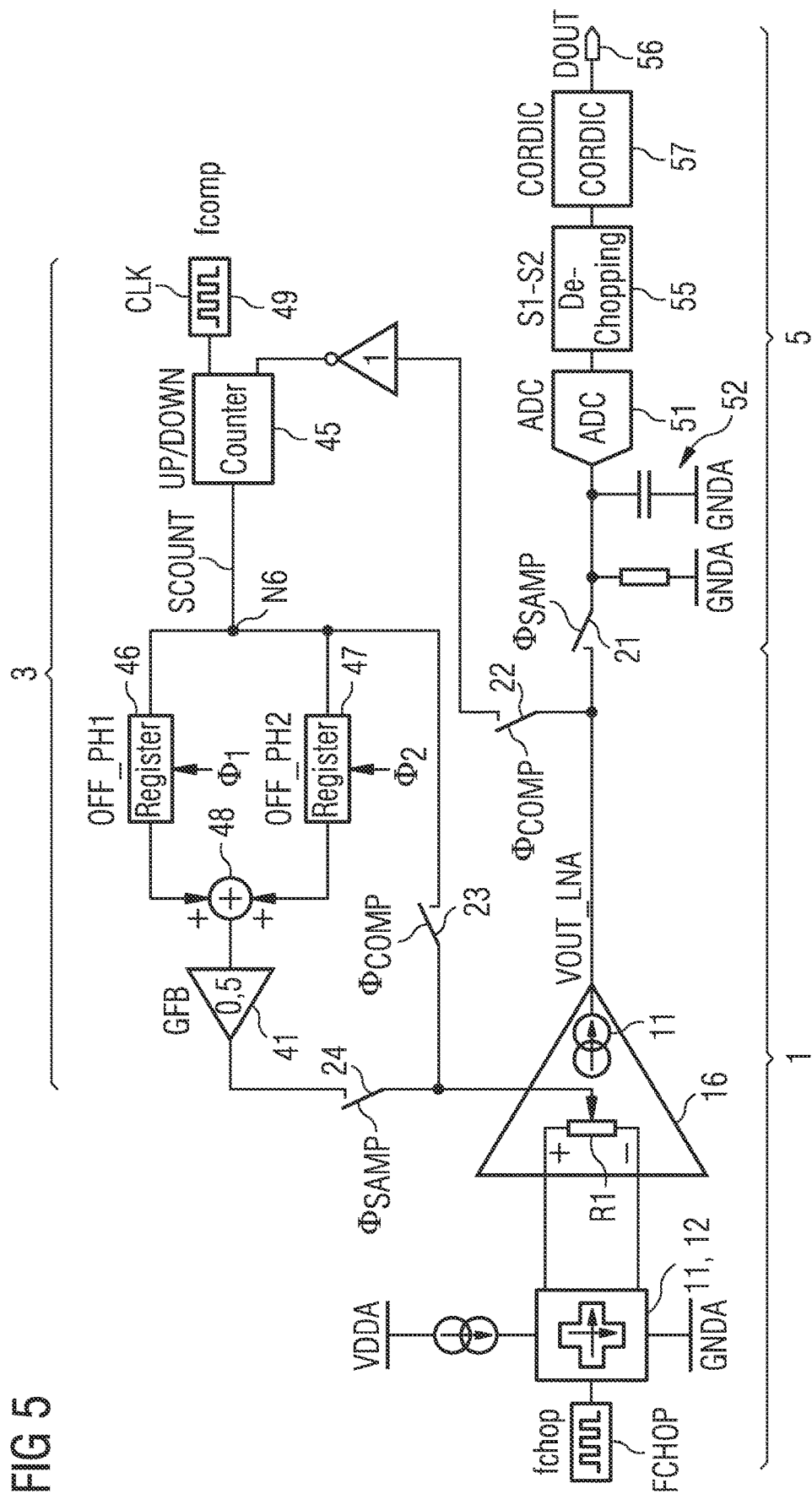
FIG. 5 shows another exemplary embodiment of a signal processing arrangement for a Hall sensor.
Figure 7:
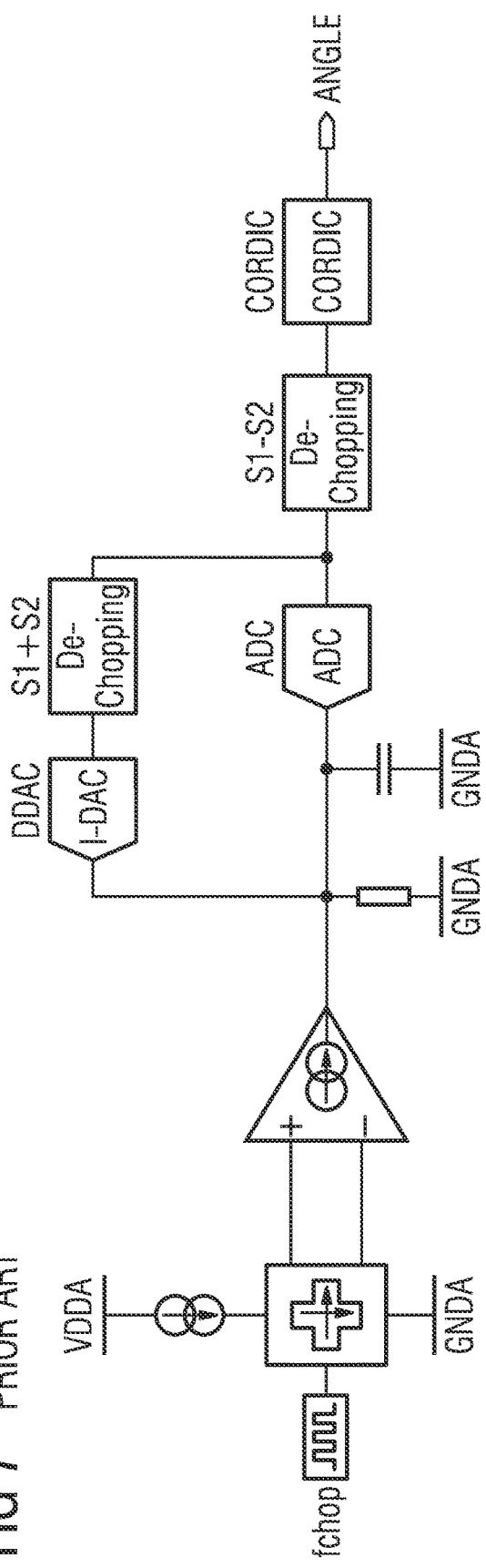
FIG. 7 shows a prior art offset compensation arrangement for a Hall sensor.
Figure 8:
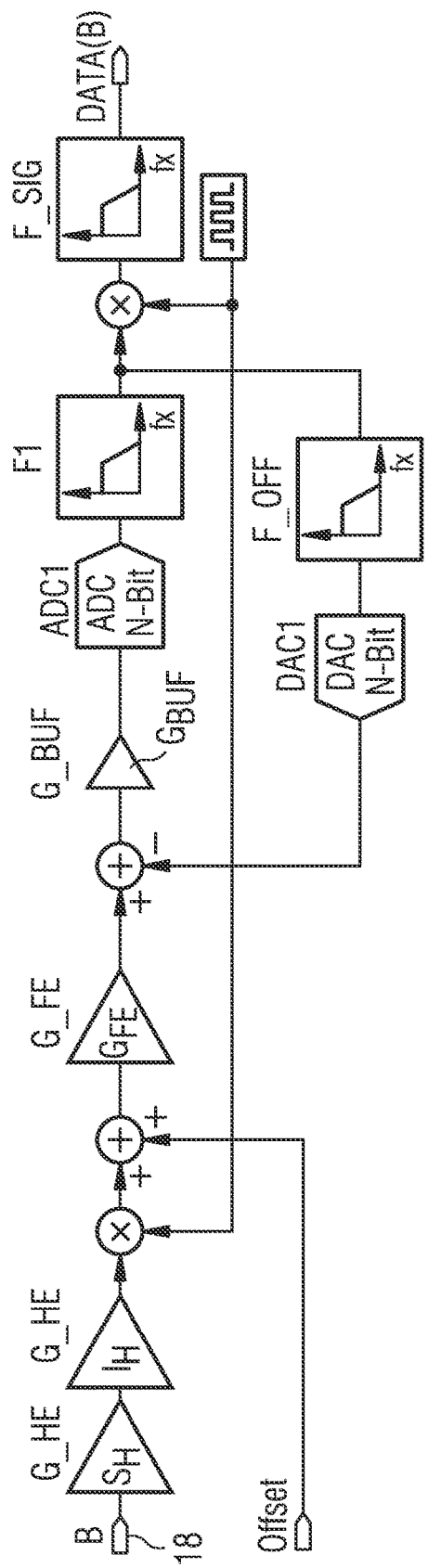
FIG. 8 shows another prior art offset compensation arrangement for a Hall sensor.

FIG. 5 shows another exemplary embodiment of a signal processing arrangement for a Hall sensor. This embodiment implements two compensation phases ΦCOMP1, ΦCOMP2. The converter path 5 is similar to the one shown in FIG. 7. The signal path 1 comprises a modified front-end amplifier 16 which comprises a compensation resistor as suggested in FIG. 3. In fact, the feedback path 3 is connected to the signal path 1 via the compensation resistor R1.

The feedback path 3 comprises the second switch, the inverter which is connected to an up/down counter 45. Furthermore, the up/down counter 45 is connected to a clock 49. As an example, clock values could range from 2 to 10 MHz as discussed above. An output of the up/down counter 45 is connected to a sixth circuit node N6 and splits into three circuit branches. The first circuit branch connects the sixth circuit node N6 via a third switch 23 and sixth circuit node N6 to the front-end amplifier 16, e.g., to the compensation resistor R1. The second and third circuit branches each comprise a register 46, 47 which at their respective output sides are connected to positive inputs of an adder 48. An output of the adder 48 connects to the auxiliary amplifier 41. The auxiliary amplifier 41, at its output side, is connected to the sixth circuit node N6 via a fourth switch 24.

Operation of the signal processing arrangement is similar to that of FIGS. 1 and 4, e.g., the feedback and generating of the compensation signal SCOR is comparable. However, further details of operation are discussed with respect to FIG. 6.

Figure 6:
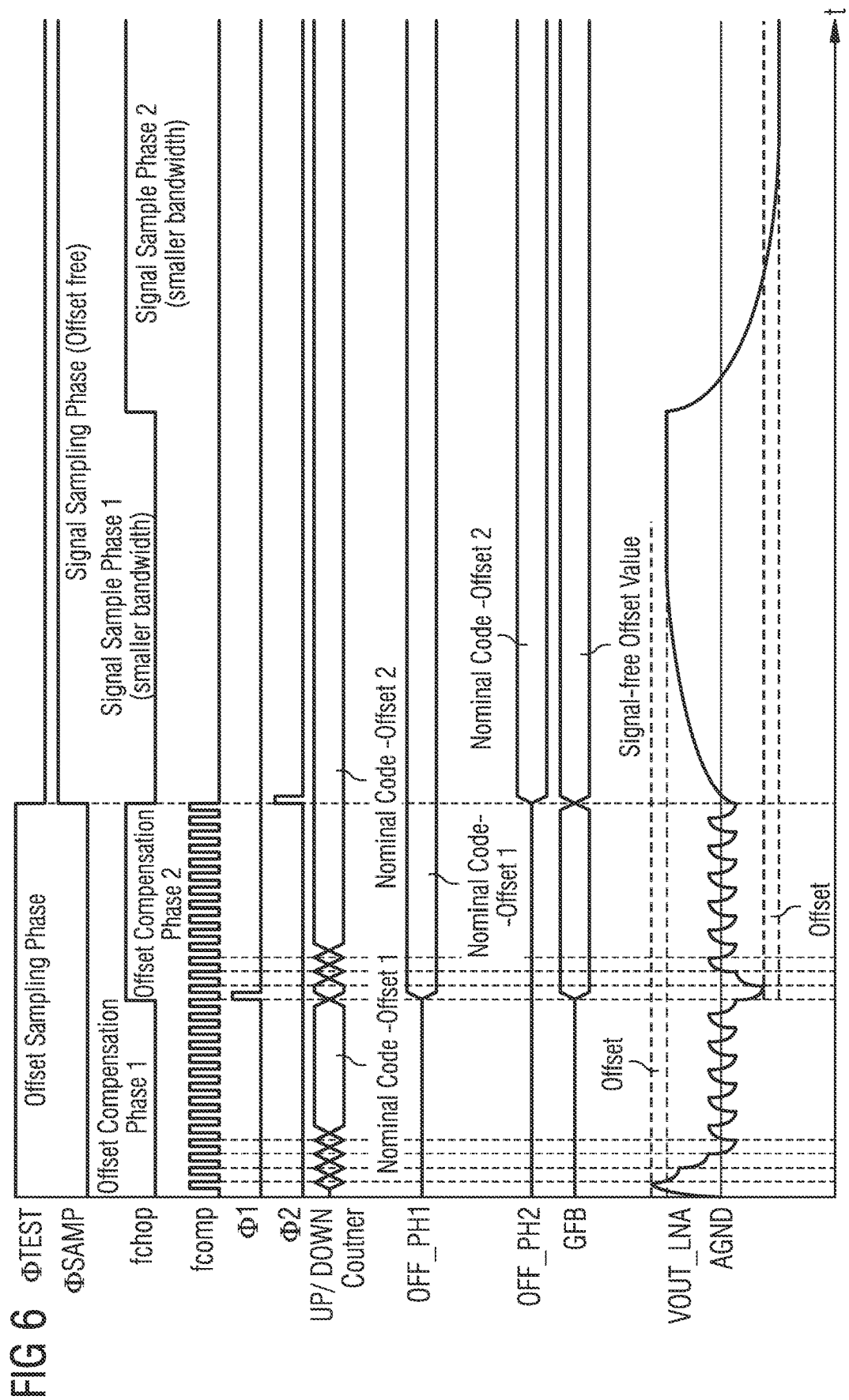
FIG. 6 shows an exemplary timing diagram for a signal processing arrangement for a Hall sensor.

FIG. 6 shows exemplary timing diagram for a signal processing arrangement for a Hall sensor. The drawing is based on the embodiment of FIG. 5. The timing diagram shows several characteristic signals as a function of time t.

The signal processing arrangement is operated in two consecutive operation phases, i.e. a compensation phase ΦCOMP followed by a sampling phase ΦSAMP. The compensation phase ΦCOMP is divided into two consecutive compensation phases ΦCOMP1, ΦCOMP2 which are defined by the chopping signal FCHOP of chopping circuit 55. Similarly, the sampling phase ΦSAMP is divided into two consecutive sampling phases ΦSAMP1, ΦSAMP2 which are defined by the chopping signal FCHOP of chopping circuit 55. In other words, the consecutive compensation phases ΦCOMP1, ΦCOMP2 and consecutive sampling phases ΦSAMP1, ΦSAMP2 are synchronized to the chopping of the Hall element 11, 12 in a spinning current process.

Furthermore, the timing diagram shows a first and second register signal Φ1, Φ2, an output signal of the up/down converter SCOUNT, output signals of the first and second register OFF_PH1, OFF_PH2, an output signal of the auxiliary amplifier GFB as well as the output signal SOUT of the signal path 1 represented as the output voltage VOUT_LNA with respect to analog ground AGND.

During the first compensation phase ΦCOMP1 the Hall element has a first current orientation. The feedback path 3 by means of the up/down counter creates a first value for OFFSET+SIGNAL (denoted nominal code−offset 1 in the drawing) which is saved in the first register 46 as register signal OFF_PH1. During the second compensation phase ΦCOMP2 the Hall element has a second current orientation. The feedback path 3 by means of the up/down counter 45 creates a second value for OFFSET−SIGNAL (denoted nominal code−offset 2 in the drawing) which is saved in the second register 47 as register signal OFF_PH2. The first and second registers 46, 47 are activated by the first and second register signal Φ1, Φ2, respectively, and provided their saved register signals OFF_PH1, OFF_PH2 to the auxiliary amplifier 41 after adding them with the adder 48. In other words, after the two compensation phases ΦCOMP1, ΦCOMP2 the adder 48 sums the register signals OFF_PH1, OFF_PH2 and divides them by two (by scaling factor 0.5 of the auxiliary amplifier 41 in the drawing) to get the real offset value and feeds this information back into the signal path 1 via the compensation resistor R1 as seen in FIG. 5.

The invention claimed is:

1. A signal processing arrangement for a Hall sensor, comprising:
   a signal path comprising a Hall element and a front-end amplifier connected in series, wherein the Hall element and the front-end amplifier are arranged to generate an output signal depending on a magnetic field;
   a feedback path comprising a compensation circuit, wherein the feedback path is coupled to the signal path, and wherein the compensation circuit comprises:
      a feedback analog-to-digital converter; and
      a feedback digital-to-analog converter, wherein the feedback analog-to-digital converter and the feedback digital-to-analog converter are coupled to each other by means of a feedback adder;
   a converter path comprising an analog-to-digital converter and an offset compensation circuit, wherein the converter path is coupled to the signal path; and
   a switch network coupled between the signal path, the feedback path, and the converter path, wherein the switch network is connected to the feedback analog-to-digital converter, and wherein:
      in a compensation phase, the switch network electrically connects the feedback path to the signal path such that the compensation circuit generates a compensation signal which is transmitted into the signal path; and
      in a sampling phase, the switch network connects the signal path to the converter path such that the output signal reduced by the compensation signal is provided at the converter path.

2. The signal processing arrangement according to claim 1, wherein in the compensation phase, the switch network electrically connects the feedback path to the signal path while the converter path is electrically disconnected from the signal path.

3. The signal processing arrangement according to claim 1, wherein the feedback path comprises a negative feedback loop.

4. The signal processing arrangement according to claim 1, wherein, in the compensation phase, the feedback path is arranged to adjust the compensation signal such that the output signal reaches a zero signal and/or a predetermined target signal.

5. The signal processing arrangement according to claim 1, wherein the output signal from the front-end amplifier is fed into the feedback path, which generates a digital value indicative of the compensation signal, wherein the feedback path comprises a register to save the digital value, and wherein the feedback path further comprises an auxiliary amplifier connected to the signal path via the switch network to provide the compensation signal to the signal path.

6. The signal processing arrangement according to claim 1, wherein the front-end amplifier comprises an adjustable compensation source which is arranged to receive the compensation signal and reduce the output signal by the compensation signal.

7. The signal processing arrangement according to claim 1, wherein
   the front-end amplifier comprises an adjustable compensation source;
   the front-end amplifier comprises a current mirror having a first and a second transistor branch; and
   the adjustable compensation source comprises an adjustable bias current source and a compensation resistor which are arranged in the first transistor branch, the second transistor branch, or both.

8. The signal processing arrangement according to claim 1, wherein
   the offset compensation circuit comprises a de-chopping circuit operating on a chopping clock signal;
   the compensation phase comprises at least two compensation sub-phases, and the sampling phase comprises at least two sampling sub-phases, wherein the at least two compensation sub-phases and the at least two sampling sub-phases are synchronized to the chopping clock signal; and
   the feedback path is arranged to combine compensation sub-signals from the at least two compensation sub-phases into the compensation signal.

9. The signal processing arrangement according to claim 1, further comprising a control unit arranged to operate the switching network in the compensation phase and the sampling phase.

10. The signal processing arrangement according to claim 1, further comprising a circuit node connecting the signal path with the converter path, wherein the circuit node is connected to the feedback path, and wherein the feedback path spans from the circuit node via the switching network to an input side of the front-end amplifier.

11. The signal processing arrangement according to claim 1, further comprising a circuit node connecting the signal path with the converter path, wherein the circuit node is connected to the feedback path, and wherein the feedback path spans from the circuit node via the switching network to the Hall element.

12. The signal processing arrangement according to claim 10, wherein an output side of the front-end amplifier is connected via the first circuit node with an input side of the analog-to-digital converter.

13. A signal processing method for a Hall sensor, the Hall sensor comprising:
   a signal path comprising a Hall element and a front-end amplifier connected in series;
   a feedback path comprising a compensation circuit; and
   a converter path comprising an analog-to-digital converter and an offset compensation circuit, the method comprising the steps of:
   generating an output signal of the signal path;
   in a compensation phase, electrically connecting the feedback path to the signal path;
   generating a compensation signal by means of the compensation circuit, wherein the compensation signal is also generated by means of a negative feedback of the feedback path, and wherein generating of the compensation signal involves an analog-to-digital conversion of the output signal followed by a digital-to-analog conversion;
   coupling the compensation signal into the signal path;
   in a sampling phase, electrically connecting the signal path to the converter path;
   reducing the output signal by the compensation signal; and
   providing the reduced output signal to the converter path.

14. The method according to claim 13, wherein the compensation signal is saved in the compensation phase and applied to the output signal in the sampling phase.

15. The method according to claim 13, wherein the compensation signal is adjusted such that the output signal reaches a zero signal and/or a predetermined target signal during the compensation phase.

16. The method according to one of claim 13, wherein the output signal, in the compensation phase, is dechopped and offset compensated downstream an analog-to-digital conversion by means of the analog-to-digital converter.

17. A signal processing arrangement for a Hall sensor, comprising:
- a signal path comprising a Hall element and a front-end amplifier connected in series, wherein the Hall element and the front-end amplifier are arranged to generate an output signal depending on a magnetic field, wherein the front-end amplifier comprises an adjustable compensation source and a current mirror, wherein the current mirror comprises a first transistor branch and a second transistor branch, and wherein the adjustable compensation source comprises an adjustable bias current source and a compensation resistor which are arranged in the first transistor branch, the second transistor branch, or both;
- a feedback path comprising a compensation circuit, wherein the feedback path is coupled to the signal path;
- a converter path comprising an analog-to-digital converter and an offset compensation circuit, wherein the converter path is coupled to the signal path; and
- a switch network coupled between the signal path, the feedback path, and the converter path, and wherein:
  - in a compensation phase, the switch network electrically connects the feedback path to the signal path such that the compensation circuit generates a compensation signal which is transmitted into the signal path; and
  - in a sampling phase, the switch network connects the signal path to the converter path such that the output signal reduced by the compensation signal is provided at the converter path.

* * * * *